(12) United States Patent
Setta (10) Patent No.: US 8,910,096 B2
(45) Date of Patent: Dec. 9, 2014

(54) FOCUS POSITION ADJUSTING APPARATUS, RETICLE, FOCUS POSITION ADJUSTING PROGRAM, AND METHOD OF MANUFACTURING SEMICONDUCTOR DEVICE

(71) Applicant: Kabushiki Kaisha Toshiba, Minato-ku (JP)

(72) Inventor: Yuji Setta, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/949,617

(22) Filed: Jul. 24, 2013

(65) Prior Publication Data

US 2014/0240683 A1 Aug. 28, 2014

(30) Foreign Application Priority Data

Feb. 26, 2013 (JP) ................................. 2013-036348

(51) Int. Cl.
*G06F 17/50* (2006.01)
*G03F 7/20* (2006.01)
*H01L 21/66* (2006.01)

(52) U.S. Cl.
CPC .............. *G03F 7/2035* (2013.01); *H01L 22/26* (2013.01)
USPC .......................................................... 716/55

(58) Field of Classification Search
CPC .............................. G03F 7/706; G03F 7/70258
USPC ...................................................... 716/100, 55
See application file for complete search history.

(56) References Cited

U.S. PATENT DOCUMENTS

| | | | |
|---|---|---|---|
| 6,633,390 B2 | 10/2003 | Shiode et al. | |
| 7,507,508 B2 | 3/2009 | Watanabe et al. | |
| 7,675,825 B2 * | 3/2010 | Ando | 369/44.32 |
| 8,142,960 B2 | 3/2012 | Nagai et al. | |
| 8,307,310 B2 | 11/2012 | Kotani et al. | |
| 2006/0256322 A1* | 11/2006 | Bowes | 356/124 |
| 2007/0195662 A1* | 8/2007 | Ando | 369/44.32 |
| 2011/0154281 A1* | 6/2011 | Zach | 716/112 |
| 2012/0233574 A1 | 9/2012 | Gyoda et al. | |

FOREIGN PATENT DOCUMENTS

| | | |
|---|---|---|
| JP | 2005-142601 | 6/2005 |
| JP | 2006-186177 | 7/2006 |
| JP | 2010-40968 | 2/2010 |
| JP | 2010-177374 | 8/2010 |
| JP | 2012-191018 | 10/2012 |

* cited by examiner

*Primary Examiner* — Suchin Parihar
(74) *Attorney, Agent, or Firm* — Oblon, Spivak, McClelland, Maier & Neustadt, L.L.P.

(57) ABSTRACT

According to one embodiment, a step difference estimation unit, an assist pattern generation unit, and a spherical aberration conversion unit are installed. The step difference estimation unit estimates step difference of a processing layer. The assist pattern generation unit adds an assist pattern having different sensitivity to spherical aberration in an exposure process to a mask pattern based on the step difference of the processing layer. The spherical aberration conversion unit converts the step difference of the processing layer into the spherical aberration.

20 Claims, 9 Drawing Sheets

FOCUS POSITION ADJUSTING APPARATUS, RETICLE, FOCUS POSITION ADJUSTING PROGRAM, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2013-36348, filed on Feb. 26, 2013; the entire contents of which are incorporated herein by reference.

FIELD

Embodiments described herein relate generally to a focus position adjusting apparatus, a reticle, a focus position adjusting program, and a method of manufacturing a semiconductor device.

BACKGROUND

In a semiconductor device, arithmetic circuits, storage circuits, and peripheral circuits are mixedly arranged on the same semiconductor chip, and thus, process step difference may occur therebetween. On the other hand, a depth of focus has been shortened according to miniaturization of the semiconductor device. In this case, since it is difficult to secure best focus for all the regions in an exposure process, process margin is insufficient, so that defective products may be made.

DETAILED DESCRIPTION

In general, according to one embodiment, a step difference estimation unit, an assist pattern generation unit, and a spherical aberration conversion unit are installed. The step difference estimation unit estimates step difference of a processing layer. The assist pattern generation unit adds an assist pattern having different sensitivity to spherical aberration in an exposure process to a mask pattern based on the step difference of the processing layer. The spherical aberration conversion unit converts the step difference of the processing layer into the spherical aberration.

Hereinafter, a pattern generation method according to embodiments will be described in detail with reference to attached drawings. The present invention is not limited to the embodiments.

First Embodiment

Figure 1:
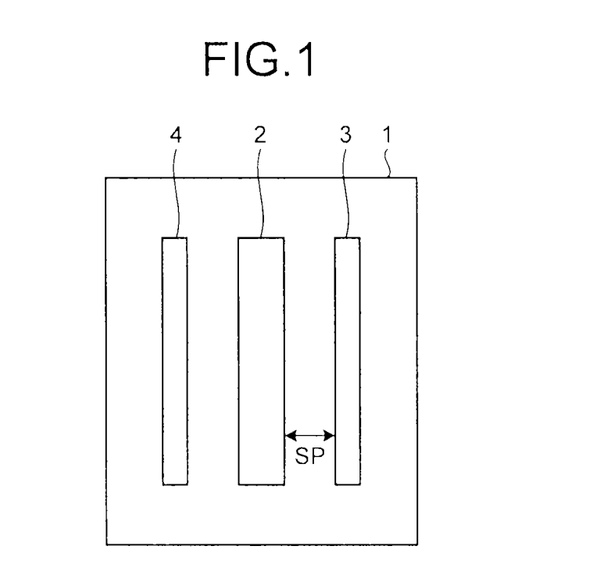
FIG. 1 is a schematic plan diagram illustrating a configuration of a mask pattern and assist patterns formed on a reticle according to a first embodiment.

FIG. 1 is a schematic plan diagram illustrating a configuration of a mask pattern and assist patterns formed on a reticle according to a first embodiment.

In FIG. 1, a mask pattern 2 is formed on a reticle 1, and assist patterns 3 and 4 are added to the mask pattern 2. In addition, the dimensions of the mask pattern 2 may be set to be equal or larger than a resolving limit in an exposure process, and the dimensions of the assist patterns 3 and 4 may be set to be equal or smaller than the resolving limit in the exposure process. In addition, the mask pattern 2 and the assist patterns 3 and 4 may be configured with a light blocking film of Cr or the like. Herein, the with respect to the assist patterns 3 and 4, sensitivities to spherical aberration in an exposure process may be set based on step difference of a processing layer. In addition, for example, the sensitivity to spherical aberration in an exposure process can be changed by adjusting a space SP between the mask pattern 2 and the assist pattern 3.

Figure 2:
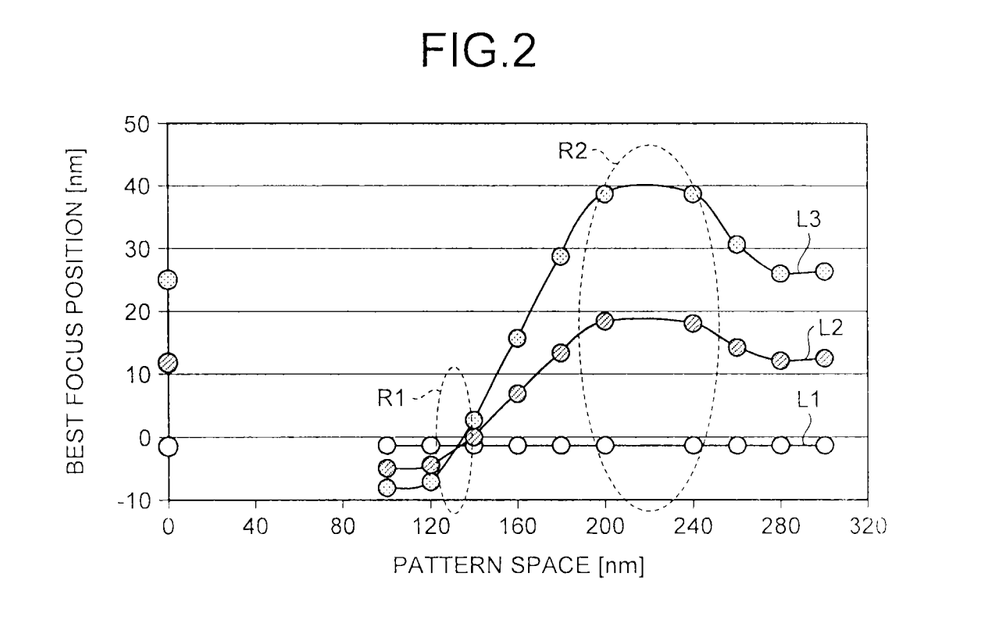
FIG. 2 is a diagram illustrating a relation between a space between the mask pattern and the assist patterns formed on the reticle according to the first embodiment and a best focus position.

FIG. 2 is a diagram illustrating a relation between the space (SP) between the mask pattern and the assist patterns formed on the reticle according to the first embodiment and a best focus position. In addition, L1 indicates the case where the value of spherical aberration is set to 0 mλ (no aberration); L2 indicates the case where the value of spherical aberration is set to 30 mλ; and L3 indicates the case where the value of spherical aberration is sent to 60 mλ.

In FIG. 2, in the case where there is no spherical aberration (L1), although the space SP between the mask pattern 2 and the assist pattern 3 is allowed to be changed, the best focus position is not changed. On the other hand, in the case where there is spherical aberration (L2 or L3), if the space SP between the mask pattern 2 and the assist pattern 3 is allowed to be changed, the best focus position is also changed. In addition, the space SP between the mask pattern 2 and the assist pattern 3 includes a range R1 where the best focus position is insensitive to a change in spherical aberration and a range R2 where the best focus position is sensitive to a change in spherical aberration.

Therefore, in the case where the space SP between the mask pattern 2 and the assist pattern 3 is set to the range R2, the spherical aberration is allowed to be changed, so that the best focus position can be changed. On the other hand, in the case where the space SP between the mask pattern 2 and the assist pattern 3 is set to the range R1, although the spherical aberration is allowed to be changed, the best focus position may not be changed. In addition, although the range R2 is most sensitive to the aberration, in the case where there is a limitation in the space SP of the mask, the ranges other than the range R2 may be appropriately used.

As a result, the assist pattern 3 where the space SP is set to the range R1 and the assist pattern 3 where the space SP is set to the range R2 are mixedly arranged on the same reticle, and the spherical aberration is allowed to be changed according to the step difference of the processing layer, so that the best focus position corresponding to the height of the processing layer can be set on the same reticle. Therefore, even in the case where there is height difference in the processing layer, the process margin in all the regions of the processing layer can be secured without preparing the reticle for the processing layer with respect to each height difference, so that it is possible to reduce the defective products.

Figure 3A:
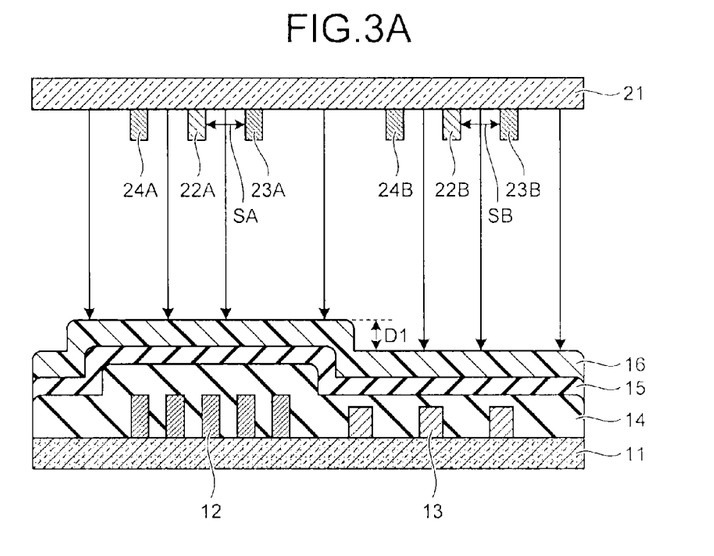
FIG. 3A is a schematic cross-sectional diagram illustrating a configuration of a reticle and an exposure object when a change in the best focus position according to process step difference is not alleviated by spherical aberration.
Figure 3B:
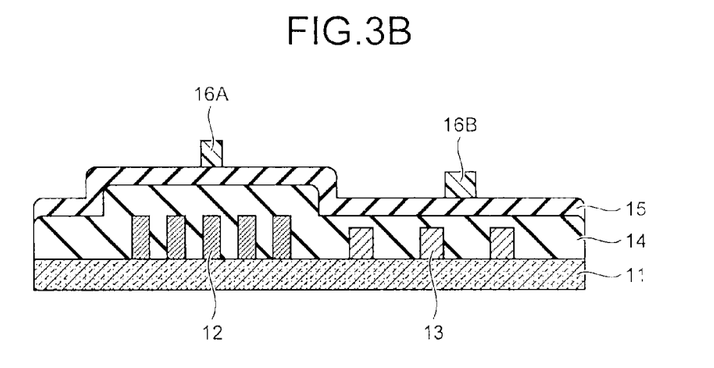
FIG. 3B is a cross-sectional diagram illustrating a resist pattern formed through a process of FIG. 3A.
Figure 4:
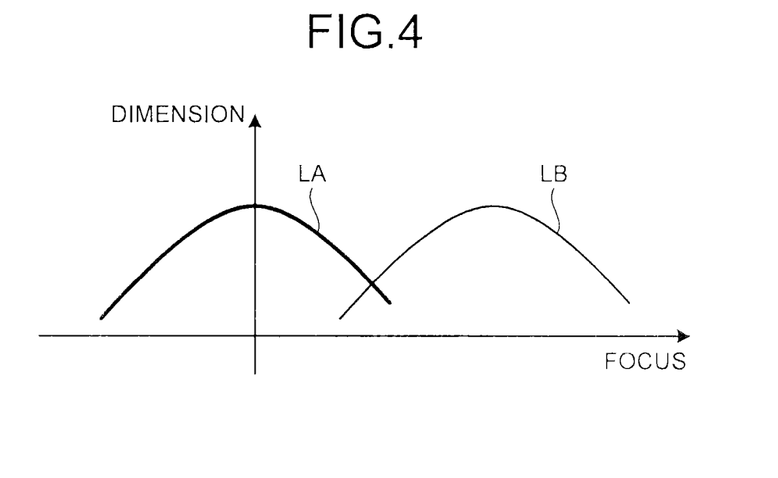
FIG. 4 is a diagram illustrating a best focus position according to process step difference in the process of FIG. 3A.

FIG. 3A is a schematic cross-sectional diagram illustrating a configuration of a reticle and an exposure object when a change in the best focus position according to process step difference is not alleviated by spherical aberration according to the first embodiment; and FIG. 3B is a cross-sectional diagram illustrating a resist pattern formed through a process of FIG. 3A. FIG. 4 is a diagram illustrating a best focus position according to process step difference in the process of FIG. 3A.

In FIG. 3A, mask patterns 22A and 22B are formed in a reticle 21. Assist patterns 23A and 24A are added to the mask pattern 22A, and assist patterns 23B and 24B are added to the mask pattern 22B. In addition, a space SA between the mask pattern 22A and the assist pattern 23A and a space SB between the mask pattern 22B and the assist pattern 23B may be configured to be equal to each other.

In the description of the present invention, although the example where a remaining pattern as a resist pattern is formed by using positive type resist is described, in the case where an extracted pattern is formed by using positive type resist, remaining and extracting of resist may also be formed to be inverted by inverting remaining and extracting of a reticle, and the description thereof will not be repeated herein.

On the other hand, a core pattern 12 and a peripheral pattern 13 are formed on a semiconductor substrate 11. An interlayer insulating film 14 is formed on the core pattern 12 and the peripheral pattern 13, and a lower-layer resin film 15 is formed on the interlayer insulating film 14. A resist film 16 is formed on the lower-layer resin film 15. Herein, there is height difference between the core pattern 12 and the peripheral pattern 13, and step difference D1 occurs in the resist film 16 corresponding to the height difference. Although the lower-layer resin film 15 can alleviate the step difference somewhat, the alleviation of the step difference is not sufficient, but step difference D1 remains between the core pattern 12 and the peripheral pattern 13. In addition, a reflection prevention film may also be used instead of the lower-layer resin film 15. In any cases, exposure is performed on the resist film 16.

After the exposure is performed on the resist film 16 through the reticle 21, the resist film 16 is developed, so that as illustrated in FIG. 3B, resist patterns 16A and 16B to which the mask patterns 22A and 22B are transferred are formed on the lower-layer resin film 15.

Herein, as illustrated in FIG. 4, due to the step difference D1 of the resist film 16, the best focus position LA of the mask pattern 22A and the best focus position LB of the mask pattern 22B are deviated from each other. Therefore, if the focus position in the exposure process is allowed to be aligned with the best focus position LA of the mask pattern 22A, focus deviation occurs at the position of the mask pattern 22B, so that the dimension of the resist pattern 16B and the dimension of the mask pattern 22B are deviated from each other.

Figure 5A:
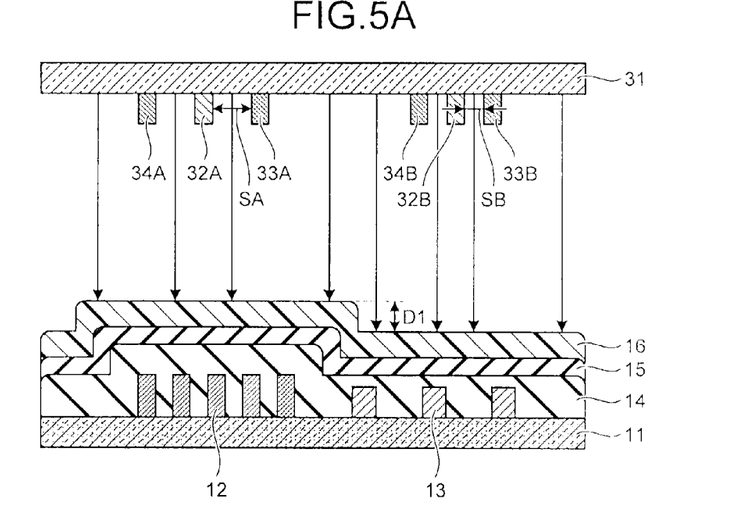
FIG. 5A is a schematic cross-sectional diagram illustrating a configuration of a reticle and an exposure object when a change in the best focus position according to process step difference is alleviated by spherical aberration.
Figure 5B:
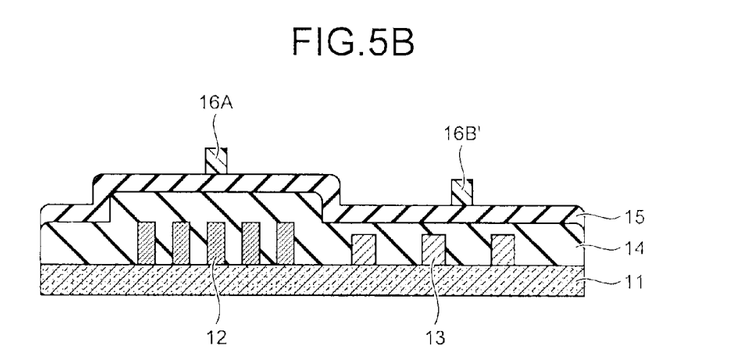
FIG. 5B is a cross-sectional diagram illustrating a resist pattern formed through a process of FIG. 5A.
Figure 6:
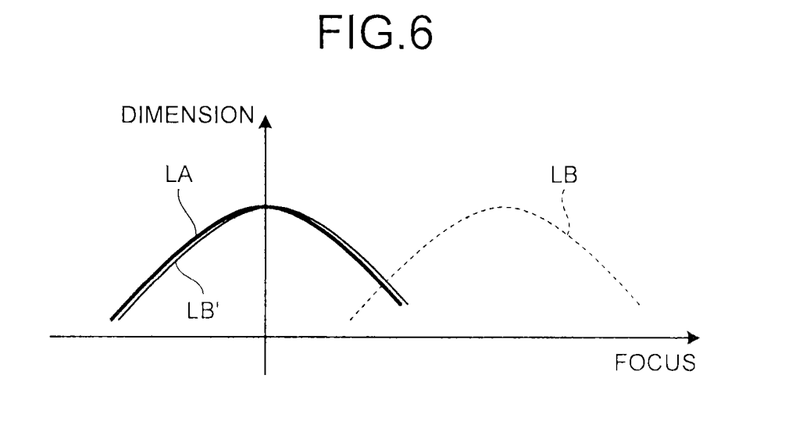
FIG. 6 is a diagram illustrating a best focus position according to process step difference in the process of FIG. 5A.

FIG. 5A is a schematic cross-sectional diagram illustrating a configuration of a reticle and an exposure object when a change in the best focus position according to process step difference is alleviated by spherical aberration; and FIG. 5B is a cross-sectional diagram illustrating a resist pattern formed through a process of FIG. 5A. FIG. 6 is a diagram illustrating a best focus position according to process step difference in the process of FIG. 5A.

In FIG. 5A, mask patterns 32A and 32B are formed in a reticle 31. Assist patterns 33A and 34A are added to the mask pattern 32A, and assist patterns 33B and 34B are added to the mask pattern 32B. In addition, a space SA between the mask pattern 32A and the assist pattern 33A and space SB between the mask pattern 32B and the assist pattern 33B may be configured to be different from each other.

After the exposure is performed on the resist film 16 through the reticle 31, the resist film 16 is developed, so that as illustrated in FIG. 5B, resist patterns 16A and 16B' to which the mask patterns 32A and 32B are transferred are formed on the lower-layer resin film 15.

Herein, as illustrated in FIG. 6, the space SB between the mask pattern 32B and the assist pattern 33B is adjusted so that a change in the best focus position LB caused from the step difference D1 of the resist film 16 is alleviated, and an exposure condition is set so that the spherical aberration corresponding to the step difference D1 of the resist film 16 occurs. As a result, in the mask pattern 32B, the best focus position can be shifted from LB to LB', so that the best focus position LA of the mask pattern 32A and the best focus position LB' of the mask pattern 32B can be configured to be coincident with each other. Therefore, even in the case where the focus position in the exposure process is allowed to be aligned with the best focus position LA of the mask pattern 32A, best focus can be set at the position of the mask pattern 32B, so that it is possible to prevent the dimension of the resist pattern 16B' and the dimension of the mask pattern 32B from being deviated from each other.

For example, if the step difference D1 of the resist film 16 is 40 nm, in the case of using a mask where the space SA between the mask pattern 32A and the assist pattern 33A is set to 130 nm and the space SB between the mask pattern 32B and the assist pattern 33B is set to 220 nm, and the value of the spherical aberration is set to the value of 60 m$\lambda$ with reference to FIG. 2. As a result, the best focus positions are different from each other by 40 nm between the mask patterns 32A and 32B, so that a change in the best focus position caused from the step difference D1 of the resist film 16 can be absorbed by the reticle 31.

Second Embodiment

Figure 7:
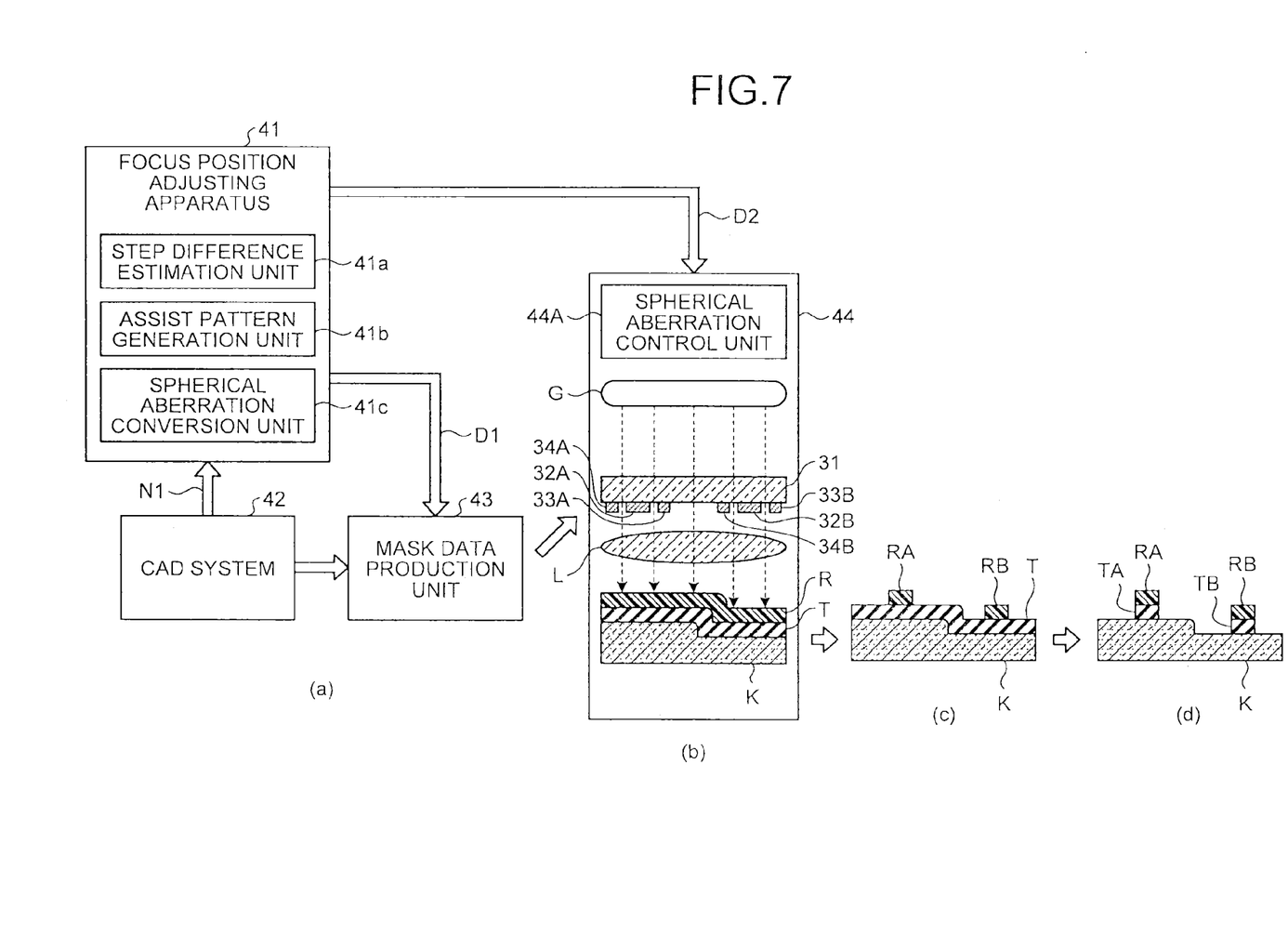
FIG. 7A is a schematic block diagram illustrating a configuration of a focus position adjusting apparatus according to a second embodiment and peripheral apparatuses thereof.
FIG. 7B is a schematic cross-sectional diagram illustrating an exposure apparatus where the focus position adjusting apparatus of FIG. 7A is used.
FIGS. 7C and 7D are cross-sectional diagrams illustrating a method of manufacturing a semiconductor device by using the focus position adjusting apparatus of FIG. 7A.

FIG. 7A is a schematic block diagram illustrating a configuration of a focus position adjusting apparatus according to a second embodiment and peripheral apparatuses thereof; FIG. 7B is a schematic cross-sectional diagram illustrating an exposure apparatus where the focus position adjusting apparatus of FIG. 7A is used; and FIGS. 7C and 7D are cross-sectional diagrams illustrating a method of manufacturing a semiconductor device by using the focus position adjusting apparatus of FIG. 7A.

In FIG. 7A, a focus position adjusting apparatus 41 includes a step difference estimation unit 41a, an assist pattern generation unit 41b, and a spherical aberration conversion unit 41c. The step difference estimation unit 41a can estimate step difference of a processing layer T. The assist pattern generation unit 41b can add assist patterns 33A, 34A, 33B, and 34B having different sensitivities to spherical aberration in an exposure process to mask patterns 32A and 32B based on the step difference of the processing layer T. The spherical aberration conversion unit 41c can convert the step difference of the processing layer T into the spherical aberration. In addition, as peripheral apparatuses of the focus position adjusting apparatus 41, a CAD system 42 and a mask data production unit 43 are installed. In addition, in FIG. 7B, an exposure apparatus 44 is configured to include a light source G, a reticle 31, a lens L, and a spherical aberration control unit 44A. The spherical aberration control unit 44A can control spherical aberration of the exposure apparatus 44. In addition, as a method of controlling the spherical aberration of the exposure apparatus 44, there may be a method of adjusting, for example, temperature or pressure of the lens L.

Next, the CAD system 42 produces design layout data N1 of a semiconductor integrated circuit and transmits the design layout data N1 to the focus position adjusting apparatus 41. The step difference estimation unit 41a estimates the step difference of the processing layer T based on the design layout data N1. Next, the assist pattern generation unit 41b generates the mask patterns 32A and 32B added with the assist patterns 33A, 34A, 33B, and 34B having different sensitivities to spherical aberration based on the step difference of the processing layer T and transmits the pattern data D1 to the mask data production unit 43. In addition, the spherical aberration conversion unit 41c converts the step difference of the processing layer T into the spherical aberration and transmits a value D2 of the spherical aberration to the exposure apparatus 44.

Next, the mask data production unit 43 produces a mask data corresponding to a layout pattern indicated by the pattern data D1. Next, the mask patterns 32A and 32B and the assist patterns 33A, 34A, 33B, and 34B specified by the mask data produced by mask data production unit 43 are formed in the reticle 31. In addition, the spherical aberration control unit 44A controls the spherical aberration of the exposure apparatus 44 so as to correspond to the value D2 of the spherical aberration transmitted from the focus position adjusting apparatus 41.

On the other hand, the processing layer T is formed on a base layer K, and the processing layer T is coated with a resist film R. In addition, for example, the base layer K may be a semiconductor substrate, an interlayer insulating film, or a wire line layer. The processing layer T may be, for example, an insulating film such as a silicon oxide film or a silicon nitride film, a semiconductor film of amorphous silicon, polycrystalline silicon, or the like, or a metal film of Al, Cu, or the like. Herein, there is height difference in the processing layer T, and thus, semiconductor device corresponding to the height difference occurs.

Next, as illustrated in FIG. 7B, exposure light such as ultraviolet ray is emitted from the light source G and is incident on the resist film R through the reticle 31 and the lens L, so that the exposure is performed on the resist film R. At this time, in the spherical aberration control unit 44A, the exposure condition is set so that the spherical aberration corresponding to the step difference of the resist film R on the processing layer T occurs.

Next, as illustrated in FIG. 7C, after the exposure is performed on the resist film R, the resist film R is developed, resist patterns RA and RB corresponding to the mask patterns 32A and 32B of the reticle 31 are formed on the processing layer T.

Next, as illustrated in FIG. 7D, the processing layer T is processed by using the resist patterns RA and RB as a mask, so that processing patterns TA and TB corresponding to the resist patterns RA and RB are formed on the base layer K.

Herein, the assist patterns 33A, 34A, 33B, and 34B are added to the mask patterns 32A and 32B so that a change in the best focus position caused from the step difference of the resist film R is alleviated, and the exposure condition is set so that the spherical aberration corresponding to the step difference of the resist film R occurs. Therefore, the focus position on the resist film R between the mask patterns 32A and 32B can be optimized, so that it is possible to improve the dimension accuracy of the processing patterns TA and TB.

Figure 8:
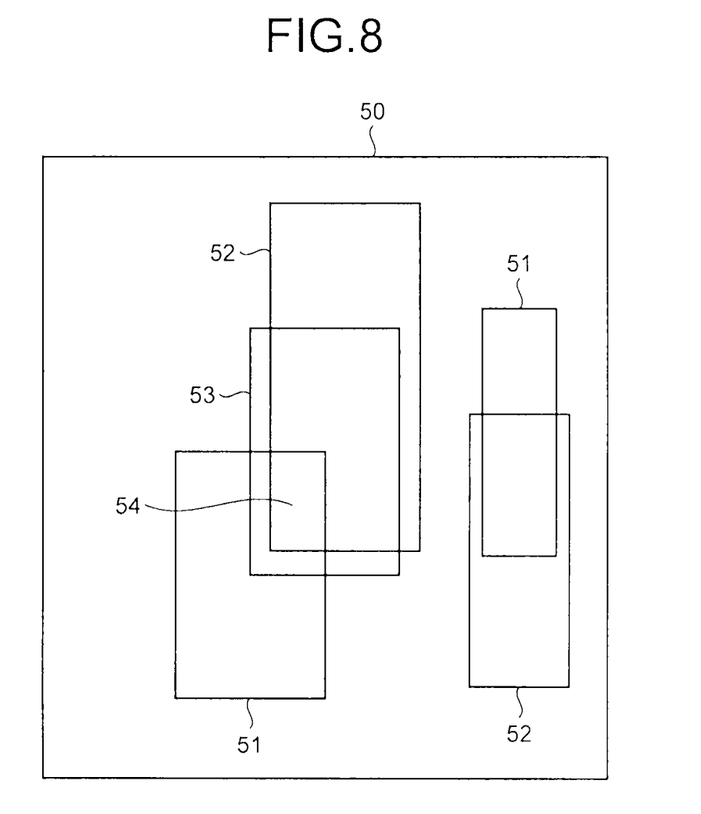
FIG. 8 is a plan diagram illustrating an example of a layout configuration used for estimating process step difference of the focus position adjusting apparatus of FIG. 7A.

FIG. 8 is a plan diagram illustrating an example of a layout configuration used for estimating process stop difference of the focus position adjusting apparatus of FIG. 7A.

As illustrated in FIG. 8, in a layout area 50, an element region 51 is installed in a first layer, an element region 52 is installed in a second layer, and an element region 53 is installed in a third layer. Herein, it can be seen that a region 54 where the element regions 51, 52, and 53 overlap each other is higher than the other regions. Therefore, in the region 54, the assist patterns 33B and 34B may be added to the mask pattern 32B of FIG. 5; and in the other regions, the assist patterns 33A and 34A may be added to the mask pattern 32A of FIG. 5. Accordingly, it is possible to alleviate the deviation in the best focus position caused from the step difference between the region 54 and the other regions, so that it is possible to improve the dimension accuracy.

In this manner, a logical process for layers used in pre-processes is performed, step difference is estimated through CMP step difference simulation, and the arrangement may be generated with a space SP of a mask pattern and an assist pattern which is defined based on a result of the estimation.

In addition, in the above-described embodiment, although the method of shifting the focus position of the side having a small height to the best focus position of the side having a large height is described, the focus position of the side having a large height may be shifted to the best focus position of the side having a small height. Otherwise, the focus position of the side having a small height and the focus position of the side having a large height may be shifted to the best focus position of the side having a middle height.

In addition, in the above-described embodiment, although the method of adjusting the focus position in the case where one step difference occurs is described, the method may also be applied to the case where two-or-more step difference occurs. In addition, in the above-described embodiment, although the method where a positive value is added to the spherical aberration is described, a negative value may be added to the spherical aberration. Therefore, in the case where a positive value is added to the spherical aberration, the best focus position may be shifted in the opposite direction.

Third Embodiment

Figure 9:
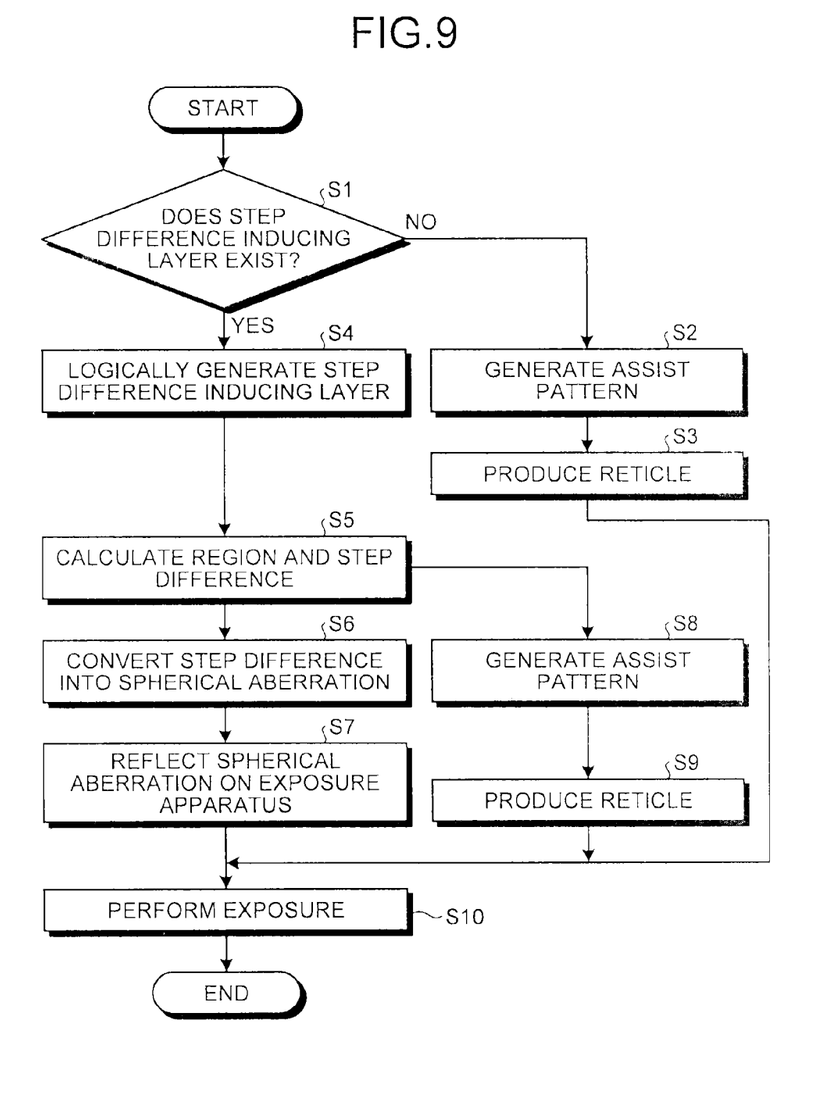
FIG. 9 is a flowchart illustrating an example of an exposure method according to a third embodiment.

FIG. 9 is a flowchart illustrating an example of an exposure method according to a third embodiment.

In FIG. 9, it is determined whether or not there is a seep difference inducing layer (S1). In the case where there is no step difference inducing layer, as illustrated in FIG. 3, assist patterns are generated (S2). Next, a reticle is produced based on the assist patterns (S3), and exposure is performed on a resist film through the reticle (S10).

On the other hand, in the case where there is a step difference inducing layer, a step difference inducing layer is logically generated (S4), and a region where step difference occurs and a value of the step difference are calculated (S5). Next, the value of the step difference is converted into spherical aberration (S6), and the spherical aberration is reflected on an exposure apparatus (S7). In addition, as illustrated in FIG. 5, assist patterns are generated so that focus deviation caused from the step difference is alleviated (S8). Next, a reticle is produced based on the assist patterns (S9), and exposure is performed on a resist film through the reticle (S10).

Figure 10:
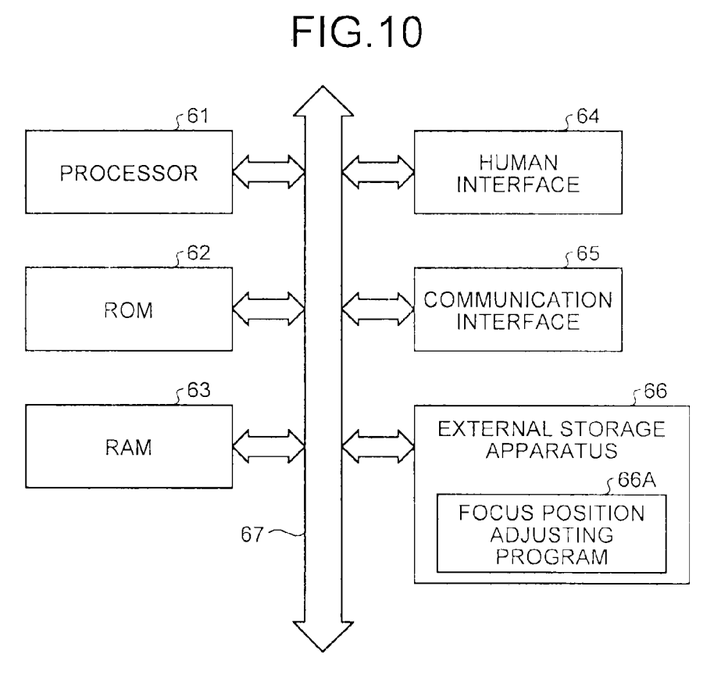
FIG. 10 is a block diagram illustrating a hardware configuration of the focus position adjusting apparatus of FIG. 7A.

FIG. 10 is a block diagram illustrating a hardware configuration of the focus position adjusting apparatus of FIG. 7A.

In FIG. 10, a focus position adjusting apparatus 41 includes a processor 61 including a CPU and the like, a ROM 62 which stores fixed data, a RAM 63 which provides work area and the like to the processor 61, a human interface 64 which serves as an interface between a human and a computer, a communication interface 65 which provides communication means with respect to external entities, and an external storage apparatus 66 which stores programs for operating the processor 61 or various types of data. The processor 61, the ROM 62, the RAM 63, the human interface 64, the communication interface 65, and the external storage apparatus 66 are connected to each other via a bus 67.

In addition, as the external storage apparatus 66, for example, magnetic discs such a hard disk drive, optical discs such as a DVD, portable semiconductor storage apparatuses such as a USB memory or a memory card, and the like may be used. In addition, as the human interface 64, for example, a keyboard, a mouse, a touch panel, or the like for the input interface may be used, and a display, a printer, or the like for the output interface may be used. In addition, as the communication interface 65, for example, a LAN card, a modem, a router, or the like for connection to the Internet, a LAN, or the like may be used.

A focus position adjusting program 66A is installed in the external storage apparatus 66. The focus position adjusting program 66A allows the assist pattern to be added to the mask pattern so that a change in the best focus position caused from the step difference of the resist film is alleviated and allows the exposure condition to be set so that the spherical aberration corresponding to the step difference of the resist film is generated.

If the focus position adjusting program 66A is executed by the processor 61, the pattern data D1 and the value D2 of the spherical, aberration are calculated based on the step difference of the resist film and are transmitted to the mask data production unit 43 and the exposure apparatus 44.

In addition, the focus position adjusting program 66A executed by the processor 61 may be stored in the external storage apparatus 66 and be read to be loaded on the RAM 63 during the program execution. Otherwise, the focus position adjusting program 66A may be stored in the ROM 62 in advance. Alternatively, the focus position adjusting program 66A may be acquired through the communication interface 65. In addition, the focus position adjusting program 66A may be executed by a stand-alone computer or may be executed by a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A focus position adjusting apparatus comprising:
   a step difference estimation unit which estimates a step difference of a processing layer;
   an assist pattern generation unit which adds a first assist pattern and a second assist pattern to a mask pattern based on the step difference of the processing layer, the first assist pattern and the second assist pattern having different sensitivity with respect to each other to spherical aberration in an exposure process; and
   a spherical aberration conversion unit which converts the step difference of the processing layer into the spherical aberration.

2. The focus position adjusting apparatus according to claim 1, wherein the dimension of the mask pattern is set to be equal to or larger than a resolving limit in the exposure process, and the dimensions of the first assist pattern and the second assist pattern are set to be equal to or smaller than the resolving limit in the exposure process.

3. The focus position adjusting apparatus according to claim 1, wherein a first space between the mask pattern and the first assist pattern and a second space between the mask pattern and the second assist pattern differ from each other according to sensitivity to the spherical aberration.

4. The focus position adjusting apparatus according to claim 1, wherein a first space between the mask pattern and the first assist pattern and a second space between the mask pattern and the second assist pattern are adjusted so that a change in a best focus position caused by the step difference is mitigated, and exposure condition is set so that spherical aberration corresponding to the step difference is generated.

5. The focus position adjusting apparatus according to claim 4, wherein the spherical aberration corresponding to the step difference is generated by adjusting temperature or pressure of a lens of an exposure apparatus.

6. A reticle comprising:
   a first mask pattern;
   a first assist pattern which is added to the first mask pattern;
   a second mask pattern; and
   a second assist pattern which is added to the second mask pattern and is different from the first assist pattern in sensitivity to spherical aberration in an exposure process, wherein the first mask pattern, the first assist pattern, the second mask pattern and the second assist pattern are allocated on a same face of the reticle.

7. The reticle according to claim 6, wherein a space between the first mask pattern and the first assist pattern is different from a space between the second mask pattern and the second assist pattern.

8. The reticle according to claim 6, wherein the dimensions of the first mask pattern and the second mask pattern are set to be equal to or larger than a resolving limit in the exposure process, and the dimensions of the first assist pattern and the second assist pattern are set to be equal to or smaller than the resolving limit in the exposure process.

9. The reticle according to claim 6, wherein in the case where there is a height difference between a first exposure region corresponding to the first mask pattern and a second exposure region corresponding to the second mask pattern, a space between the second mask pattern and the second assist pattern is set so that the second exposure region is aligned with a best focus position when the first exposure region is aligned with a best focus position.

10. A non-transitory computer readable medium incorporating a pattern generation program causing a computer to execute:
estimating a step difference of a processing layer;
adding a first assist pattern and a second assist pattern to a mask pattern based on the step difference of the processing layer, the first assist pattern and the second assist pattern having different sensitivity with respect to each other to spherical aberration in an exposure process; and
converting the step difference of the processing layer into the spherical aberration.

11. The non-transitory computer readable medium according to claim 10, wherein the step difference of the processing layer is estimated based on an overlap degree where element regions arranged in a layout area overlap each other.

12. The non-transitory computer readable medium according to claim 11, wherein the dimension of the mask pattern is set to be equal to or larger than a resolving limit in the exposure process, and the dimensions of the first assist pattern and the second assist pattern are set to be equal to or smaller than the resolving limit in the exposure process.

13. The non-transitory computer readable medium according to claim 11, wherein a first space between the mask pattern and the first assist pattern and a second space between the mask pattern and the second assist pattern differ from each other according to the sensitivity to the spherical aberration.

14. The non-transitory computer readable medium according to claim 11, wherein a first space between the mask pattern and the first assist pattern and a second space between the mask pattern and the second assist pattern are adjusted so that a change in a best focus position caused by the step difference is mitigated, and exposure condition is set so that spherical aberration corresponding to the step difference is generated.

15. A method of manufacturing a semiconductor device, comprising:
coating a processing layer with a resist film;
exposing the resist film through a mask pattern, the mask pattern including a first assist pattern and a second assist pattern having different sensitivity with respect to each other to spherical aberration according to a step difference of the processing layer;
transferring the mask pattern to the resist film by developing the exposed resist film; and
processing the processing layer by using the resist film as a mask to which the mask pattern is transferred.

16. The method according to claim 15, wherein the dimension of the mask pattern is set to be equal to or larger than a resolving limit in the exposure process, and the dimensions of the first assist pattern and the second assist pattern are set to be equal to or smaller than the resolving limit in the exposure process.

17. The method according to claim 15, wherein a first space between the mask pattern and the first assist pattern and a second space between the mask pattern and the second assist pattern differ from each other according to sensitivity to the spherical aberration.

18. The method according to claim 15, wherein a first space between the mask pattern and the first assist pattern and a second space between the mask pattern and the second assist pattern are adjusted so that a change in a best focus position caused by the step difference is mitigated, and exposure condition is set so that spherical aberration corresponding to the step difference is generated.

19. The method according to claim 18, wherein the spherical aberration corresponding to the step difference is generated by adjusting temperature or pressure of a lens of an exposure apparatus.

20. The method according to claim 15, wherein in the case where a core pattern and a peripheral pattern are formed in the processing layer and there is a height difference between the core pattern and the peripheral pattern, a first space between the mask pattern and the first assist pattern and a second space between the mask pattern and the second assist pattern are set so that an exposure region of the peripheral pattern is aligned with a best focus position when an exposure region of the core pattern is aligned with a best focus position.

* * * * *